United States Patent
Tiziani et al.

(10) Patent No.: US 8,806,293 B2
(45) Date of Patent: Aug. 12, 2014

(54) CONTROLLER TO EXECUTE ERROR CORRECTING CODE ALGORITHMS AND MANAGE NAND MEMORIES

(75) Inventors: Federico Tiziani, Muggio (IT); Giovanni Campardo, Bergamo (IT); Massimo Iaculo, San Marco Evangelista (IT); Claudio Giaccio, Torre del Greco (IT); Manuela Scognamiglio, Burago Molgora (IT); Danilo Caraccio, Buonalbergo (IT); Ornella Vitale, Cicciano (IT); Antonino Pollio, Vico Equense (IT)

(73) Assignee: Micron Technology, Inc., Boise, ID (US)

( * ) Notice: Subject to any disclaimer, the term of this patent is extended or adjusted under 35 U.S.C. 154(b) by 326 days.

(21) Appl. No.: 13/122,909

(22) PCT Filed: Oct. 9, 2008

(86) PCT No.: PCT/IB2008/002658
§ 371 (c)(1),
(2), (4) Date: Sep. 1, 2011

(87) PCT Pub. No.: WO2010/041093
PCT Pub. Date: Apr. 15, 2010

(65) Prior Publication Data
US 2011/0307762 A1  Dec. 15, 2011

(51) Int. Cl.
*H03M 13/00* (2006.01)
*G06F 11/10* (2006.01)
*G06F 13/16* (2006.01)

(52) U.S. Cl.
CPC .................. *G06F 11/10* (2013.01); *G06F 13/1668* (2013.01)
USPC .................. 714/763; 365/185.09; 365/185.33

(58) Field of Classification Search
USPC ............ 714/763; 365/185.02, 185.09, 185.33
See application file for complete search history.

(56) References Cited

U.S. PATENT DOCUMENTS

| | | | |
|---|---|---|---|
| 5,918,242 A | 6/1999 | Sarma et al. | |
| 7,350,044 B2 * | 3/2008 | Keays | 711/165 |
| 7,483,329 B2 * | 1/2009 | Luo et al. | 365/226 |
| 8,131,912 B2 * | 3/2012 | Ozawa et al. | 711/103 |
| 8,151,163 B2 * | 4/2012 | Shalvi et al. | 714/758 |

(Continued)

FOREIGN PATENT DOCUMENTS

| | | |
|---|---|---|
| DE | 112008004033 T5 | 1/2012 |
| JP | 2007161748 A | 6/2007 |
| JP | 2008102693 A | 5/2008 |
| JP | 2009003994 A | 1/2009 |

OTHER PUBLICATIONS

Chinese Application Serial No. 200880131514.3, Office Action mailed Feb. 24, 2014, 10 pgs.

(Continued)

*Primary Examiner* — Esaw Abraham
(74) *Attorney, Agent, or Firm* — Schwegman, Lundberg & Woessner, P.A.

(57) ABSTRACT

A single virtualized ECC NAND controller executes an ECC algorithm and manages a stack of NAND flash memories. The virtualized ECC NAND controller allows the host processor to drive the stack of flash memory devices as a single NAND chip while the controller redirects the data to the selected NAND memory device in the stack.

20 Claims, 3 Drawing Sheets

(56) References Cited

U.S. PATENT DOCUMENTS

| | | | |
|---|---|---|---|
| 8,291,295 B2 * | 10/2012 | Harari et al. | 714/763 |
| 2003/0156454 A1 | 8/2003 | Wei et al. | |
| 2007/0165457 A1 | 7/2007 | Kim | |
| 2008/0046630 A1 | 2/2008 | Lasser | |

OTHER PUBLICATIONS

Chinese Application Serial No. 200880131514.3, Office Action mailed Apr. 17, 2013, 17 pgs.

Chinese Application Serial No. 200880131514.3, Response filed Oct. 29, 2013 to Office Action mailed Arp. 17, 2013, 12 pgs.

Japanese Application Serial No. 2011-530580, Office Action mailed May 28, 2013, 11 pgs.

Japanese Application Serial No. 2011-530580, Response filed Oct. 17, 2013 to Office Action mailed May 28, 2013, 17 pgs.

Japanese Application Serial No. 2011-530580, Examiners Decision of Final Refusal mailed Apr. 1, 2014, w/English Translation, 6 pgs.

\* cited by examiner

US 8,806,293 B2

CONTROLLER TO EXECUTE ERROR CORRECTING CODE ALGORITHMS AND MANAGE NAND MEMORIES

CROSS-REFERENCE TO RELATED APPLICATION

This patent application is a U.S. National Phase application under 35 U.S.C. §371 of International Application No. PCT/IB2008/002658, filed Oct. 9, 2008, entitled VIRTUALIZED ECC NAND.

Today's communication devices continue to become more sophisticated and diverse in providing increasing functionality. These devices support multimedia that requires higher capacity memory, particularly that afforded by multiple chip package designs. Communications links, busses, chip-to-chip interconnects and storage media may operate with high levels of intrinsic signal/storage failures. These communication devices are expected to incorporate error detection and correction mechanisms. ECC (Error Correcting Codes) has moved into memory storage structures but additional improvements are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
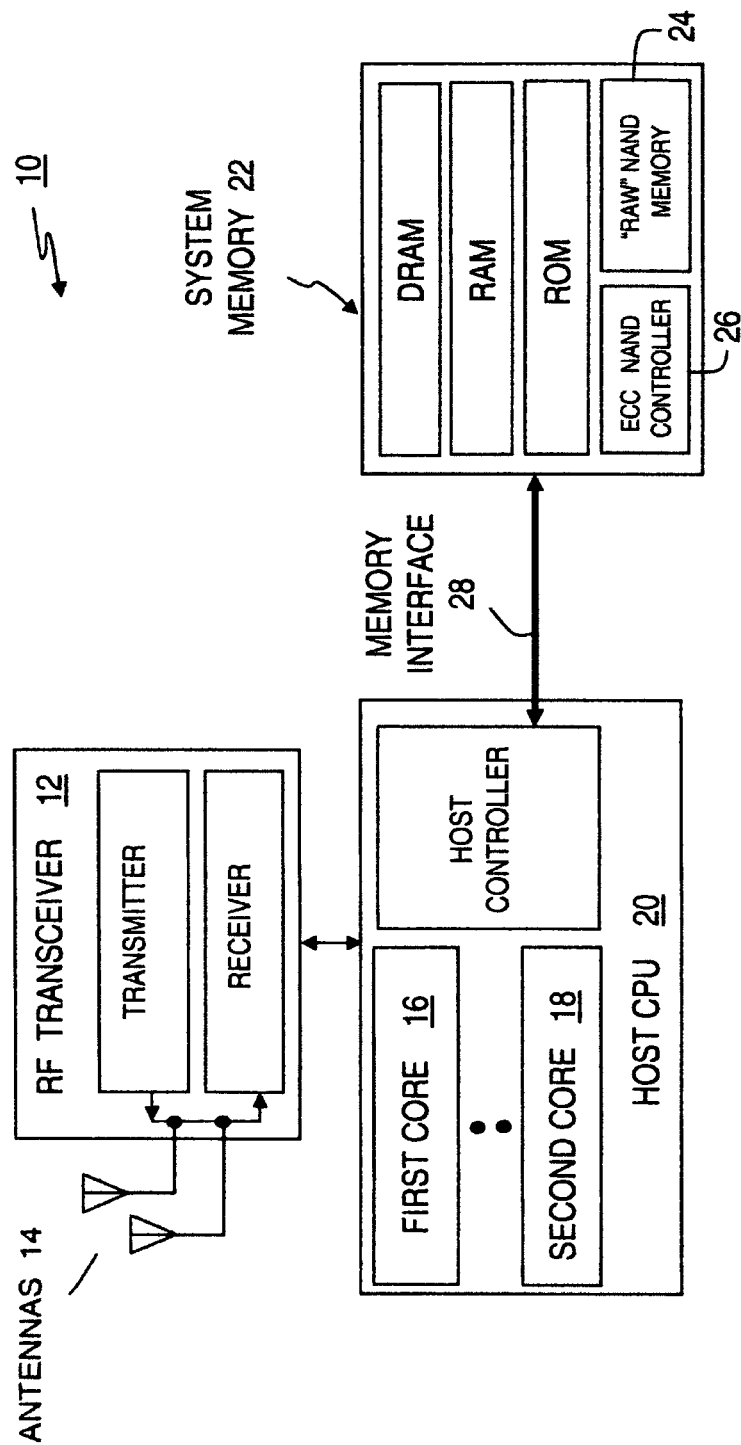
FIG. 1 illustrates a wireless architecture that incorporates a virtualized ECC NAND controller to execute the ECC algorithm and manage data transfers between a host processor and a stack of NAND memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a communications device 10 that may include nonvolatile memory with a virtualized ECC NAND controller servicing multiple NAND flash devices in accordance with the present invention. The present invention is not limited to wireless communication embodiments and other, non-wireless applications may use the present invention. As shown in this wireless embodiment, communications device 10 includes one or more antenna structures 14 to allow radios to communicate with other over-the-air communication devices. As such, communications device 10 may operate as a cellular device or a device that operates in wireless networks such as, for example, Wireless Fidelity (Wi-Fi), WiMax, Mobile WiMax, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating with different frequency bands in an RF/location space with other devices in a network.

The embodiment illustrates the coupling of antenna structure 14 to a transceiver 12 to accommodate modulation/demodulation. In general, analog front end transceiver 12 may be a stand-alone Radio Frequency (RF) discrete or integrated analog circuit, or transceiver 12 may be embedded with a host Central Processing Unit (CPU) 20 having one or more processor cores 16 and 18. The multiple cores allow processing workloads to be shared across the cores and handle baseband functions and application functions. Data and instructions may transfer between the CPU and memory storage through a memory interface 28.

System memory 22 may include both volatile memory and nonvolatile memory such as, for example, NAND memory structures 24. Note that the volatile and nonvolatile memories may be packaged separately, or alternatively, be combined in a stacking process. In particular, the multiple NAND memory structures may be placed in a Multi-Chip Package (MCP) to reduce the footprint on a board. Thus, the various embodiments of system memory 22 show that memory devices may be arranged in different ways by mixing memory devices and configurations to utilize the limited space within communication products, and various package options may be used to find the right combination of low power and high reliability.

In prior art, an ECC (Error Correcting Code) algorithm performed internally to a NAND memory is restricted to provide error detection and correction mechanisms that are applicable to only that single memory device. It is costly to update a fixed host platform to support a new NAND technology in terms of ECC needs, page size, address capability, new command set specification, etc. Further restricting, the ECC algorithm is technology specific. For example, a change between Single Level Cell (SLC) technology and Multi Level Cell (MLC) technology would invalidate the ECC algorithm in-use. Additionally, a replacement memory having a different product shrink level would necessitate a modification to the existing ECC algorithm. And, present memory devices having internally incorporated ECC impose a cost penalty based on the combined die area for the flash and the ECC algorithm logic.

Figure 2:
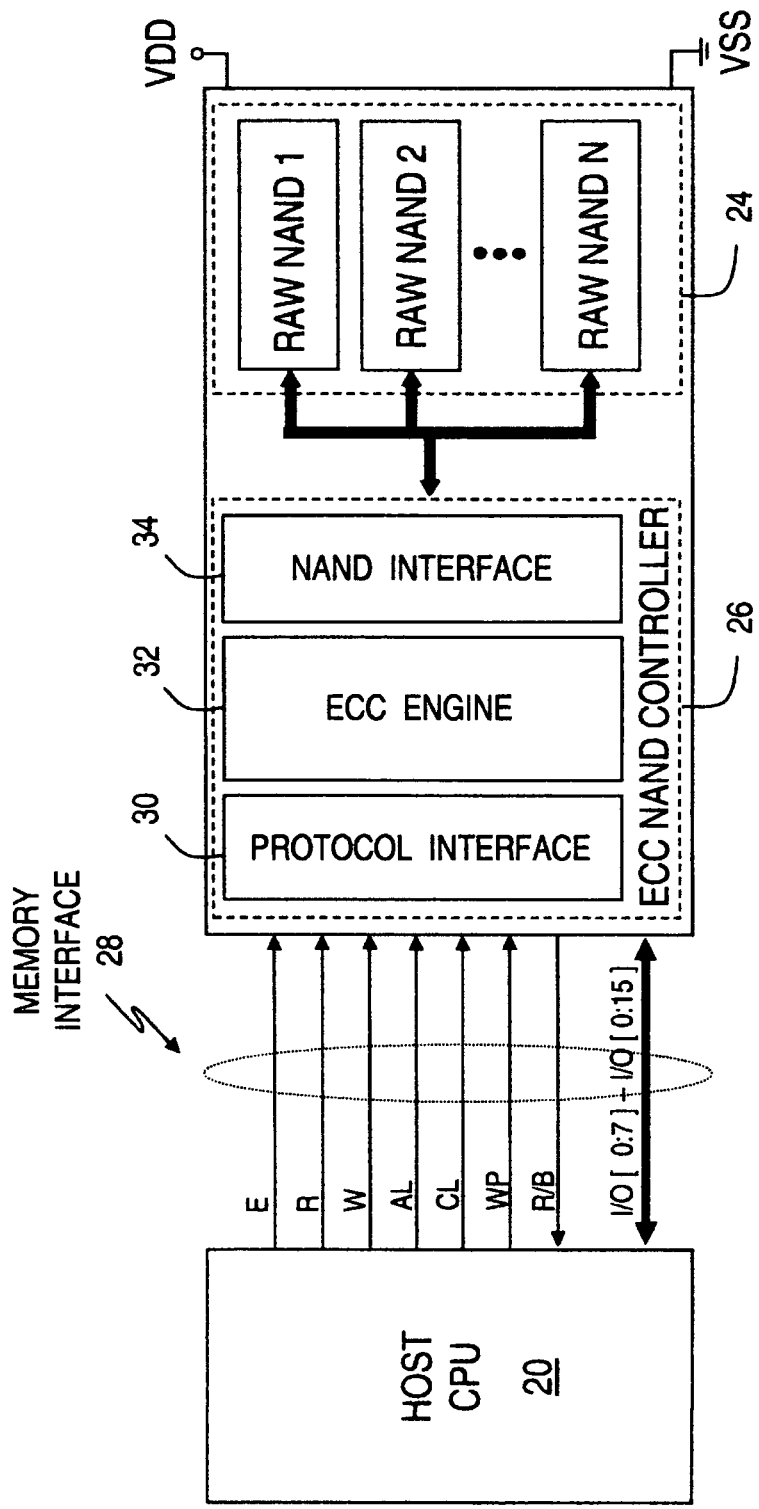
FIG. 2 illustrates the host processor to memory interface with the virtualized ECC NAND controller providing functional blocks that both execute the ECC algorithm and manage the data transfers to the stack of NAND memory.

To overcome these deficiencies and in accordance with the present invention, the architecture illustrated in FIG. 2 allows a single virtualized ECC NAND controller 26 to service multiple NAND memory structures, i.e., a "raw" memory stack 24. The term "raw" implies that the NAND memory devices do not internally implement an ECC algorithm. Host CPU 20 drives the virtualized ECC NAND controller 26 and the raw NAND memory structures as a single memory system regardless the number of raw NAND memories inside it. Moreover, the power consumption is reduced compared with the prior art stacked architecture because this solution can select one NAND a time. Virtualized ECC NAND controller 26 includes a protocol interface 30 that exchanges signals with host CPU 20; an ECC engine 32 that serves to implement the ECC algorithm; and a NAND interface 34 that manages memory stack 24.

Virtualized ECC NAND controller 26 functions as the bridge from the host NAND interface to the raw NAND memory stack and provides the right ECC algorithm to the host for the raw NAND provided in the system memory. The host side operates with its standard NAND interface, address space, command set, page size, ECC, etc., and virtualized ECC NAND controller 26 adapts the host side to the specific raw NAND that is incorporated into the memory stack.

By removing the ECC functionality from individual NAND memory devices in the NAND stack and incorporating that functionality in the ECC NAND controller 26, a variety of features may be realized. With ECC NAND controller 26 external to the NAND memory devices, the host side realizes a virtualized address space that permits the host to drive the system as a single NAND chip even though multiple NAND memory devices are in the storage system. Thus, host CPU 20 is free to manage more chips at the interface. In other words, with host CPU 20 managing one chip at the interface, virtualized ECC NAND controller 26 can manage the NAND memory devices in the stacked memory.

Prior art products implement ECC along with data management algorithms such as, for example, Flash Translation Layer (FTL), wear leveling, bad block management, etc. into a common integrated circuit. In contrast, the architecture presented in the figure separates ECC from the data management algorithms. Virtualized ECC NAND controller 26 implements only the ECC algorithm and not any other data management algorithm. This allows host CPU 20 to maintain full control of the virtualized memory in terms of data pages and the metadata area and virtualized ECC NAND controller 26 to provide a better ECC engine.

In utilizing virtualized ECC NAND controller 26 as the bridge from the host NAND interface to the raw NAND memory stack, the host platform can manage a page size that is different from the page size of the raw NAND. Further, virtualized ECC NAND controller 26 isolates the host platform from the memory stack, allowing host CPU 20 to use some commands that are not supported by the raw NAND. In one embodiment host CPU 20 may have a larger command set than the command set of the physical memory devices in the virtualized ECC NAND, while in another embodiment the command set of the host may be a reduced command set compared to the command set inside the Virtualized ECC NAND. In either embodiment, the logic within ECC NAND controller 26 adapts the command set of host CPU 20 to the command set of the physical memory devices. The host platform may use a basic NAND command set and the virtualized NAND controller 26 may use an extended new command set.

Figure 3:
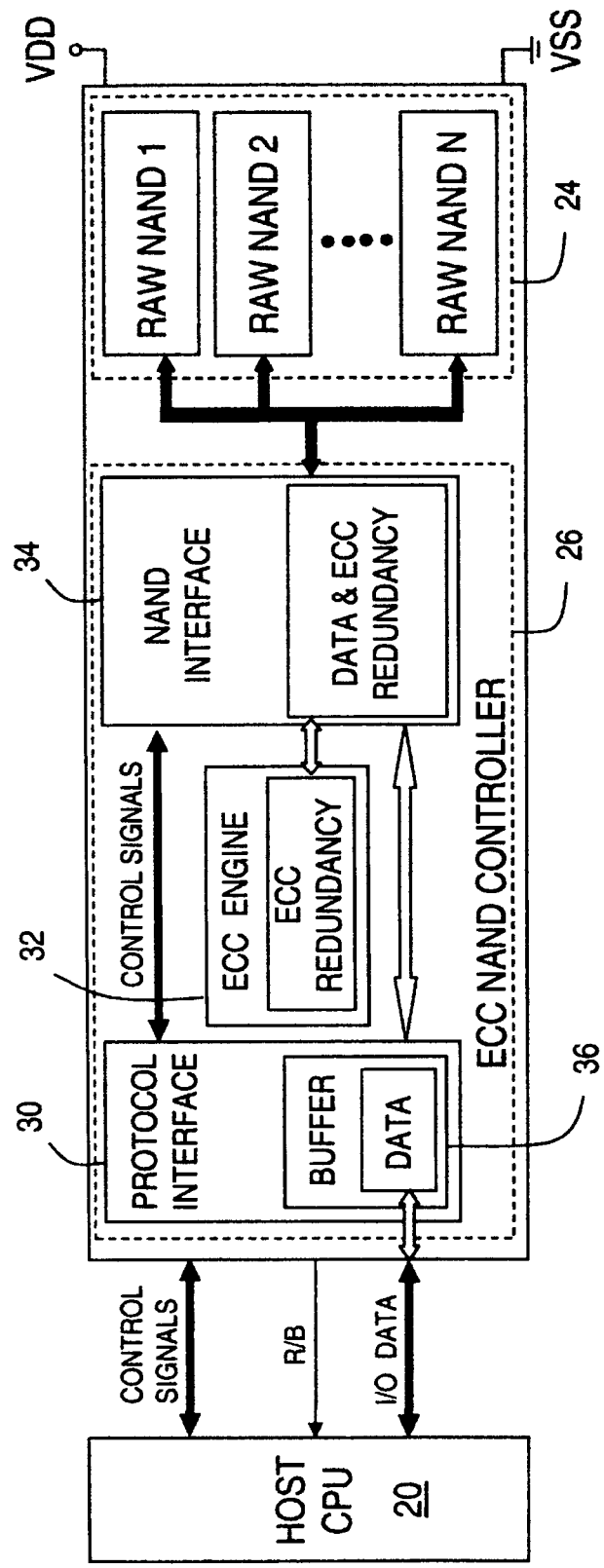
FIG. 3 shows further details of the virtualized ECC NAND controller.

FIG. 3 shows further details that allow host CPU 20 to interface to protocol interface 30 via electrical connections that are left unchanged from the protocol specification, allowing the host to communicate to a single memory system with a large error free address space. Put another way, this architecture allows host CPU 20 to provide data exchanges as a standard NAND interface with memory stack 24, keeping a virtual command set and address space.

Simultaneously and without adding internal logic to the host platform, ECC NAND 26 provides the ECC function to increase the overall reliability of data exchanges by correcting bit errors in the raw NAND. The addressing is virtualized because the host CPU 20 drives the connected memory device as if it was a single NAND chip, while the virtualized ECC NAND controller 26 redirects the data towards a selected NAND of the stack. Thus, a single virtualized ECC NAND controller 26 manages the stack of NAND flash memories and performs the ECC algorithm.

Further, this architecture with the virtualized ECC NAND controller 26 between the host CPU 20 and memory stack 24 makes it possible to adapt the use of a single NAND device to a host capable of managing a set of NAND memories using different Chip Enable (CE) pins. In one embodiment the host interface selectively drives different flash memories by the use of the CE signal while the virtualized ECC NAND is made up of a single NAND chip of higher densities. The internal logic of virtualized ECC NAND controller 26 translates the request from host CPU 20 which asserts one of the CE's into an operation which addresses a part of the NAND array, encoding the request in the address cycle which is supported by the selected NAND memory device itself. It should be noted that host CPU 20 may have a number of address cycles lower than the number of cycles required by a raw NAND memory device. Again, the host platform may manage a page size different from the page size of a raw NAND memory device and even use some commands not supported by the memory device such as, for example, a multi-plane operation or a cache operation.

For example, if the raw NAND memory device does not support the multi-plane operations, virtualized ECC NAND controller 26 can emulate these commands by two channels. If the raw NAND memory device does not support the cache operations, virtualized ECC NAND controller 26 can emulate the commands with an internal ping-pong buffer, etc. Furthermore, if the host platform needs a page size different from the page size of the raw NAND memory device, then virtualized ECC NAND controller 26 provides a virtualized physical block with a page size and a number of pages different from the real ones.

Protocol interface 30 is the portion of virtualized ECC NAND controller 26 that communicates with host CPU 20 using the standard NAND communication protocol. Protocol interface 30 interprets any received commands and further directs the storage of any data that the host transfers. Moreover, protocol interface 30 manages the NAND Ready/Busy signal in order to take into account the ECC algorithm latency. Protocol interface 30 includes an internal buffer 36 to store data transferred by host CPU 20 during a program operation. Following a confirm command protocol interface 30 sets the busy signal low in order to avoid any kind of data operation towards virtualized ECC NAND controller 26.

The size of buffer 36 is suitably chosen to reduce the latency introduced by the ECC calculation. With the proper buffer size the host CPU 20 may start to send a new page during a write operation without waiting for the previous flash program operation to end. This timing advantage is beneficial during a sequential read operation, and therefore, while ECC engine 32 calculates the redundancy on the current page, the next page can be retrieved from raw NAND.

ECC engine 32 is the portion of virtualized ECC NAND controller 26 that serves to implement the ECC algorithm that calculates the redundancy on data sent by host CPU 20. The ECC algorithm is used to detect and correct errors that happen to the original information during storage, writing or reading to or from stacked memory 24. The ECC algorithm may implement multilevel, cyclic, error-correcting, variable-length digital codes to correct multiple random error patterns. As such, ECC engine 32 may implement a BCH code or a Reed-Solomon algorithm.

During a write operation, the ECC algorithm calculates the redundancy on data sent by host. The redundancy, once calculated, is added to the host data and transferred to the NAND flash page buffer. During a read operation, ECC engine 32 re-calculates the redundancy on the data coming from raw NANDs for comparing against the old redundancy value previously stored in the flash memory. If the two redundancies are equal, then the data is correct and allowed to transfer from the protocol interface buffer to the host CPU 20. However, if the two redundancies are not equal ECC engine 32 corrects the data bits in error before data may transfer to the host CPU 20. A read fail is signaled to host CPU 20 if the number of errors is higher than the ECC correction capability.

NAND interface 34 is the portion of virtualized ECC NAND controller 26 that serves to communicate with the raw NANDs by re-elaborating both the commands and the address previously received from the host CPU 20. Thus, in a write operation the data is transferred from the protocol interface buffer to the selected flash memory. In this function, NAND interface 34 decodes the address to redirect the received data to the selected NAND and sends the new payload of data plus ECC redundancy to the selected raw NAND in stacked memory 24. During this operation the busy signal remains low and transitions to a high signal level when the raw NAND program operation ends.

During a read operation, NAND interface 34 transfers data from the selected raw NAND to buffer 36 in protocol interface 30. In the meanwhile, ECC engine 32 processes the data to calculate the related parity for comparison with the redundancy read from the flash storage, and if necessary, bit corrections are performed.

When protocol interface 30 has one Chip Enable pin and NAND interface 34 has more then one Chip Enable pin, the address is decoded in order to redirect the data towards the selected raw NAND memory device of the memory stack. On the other hand, when protocol interface 30 has more Chip Enable pins than NAND interface 34, the address is decoded in order to redirect the data to the right part of the raw NAND depending on which Chip Enable is low.

By using virtualized ECC NAND controller 26 to execute the ECC algorithm external to the stack of NAND flash memories, a flexible memory system solution is ensured as far as the technology and the number of memory devices. In fact, virtualized ECC NAND controller 26 may continue to operate irrespective of whether the non-volatile memory included in the memory stack 24 is SLC and/or MLC. Furthermore, virtualized ECC NAND controller 26 is capable of managing multiple flash NAND devices and even accommodates memory devices having different shrink levels. Also note that a change of ECC correction capabilities within virtualized ECC NAND controller 26 does not impact the flash NAND design. Moreover, power consumption is reduced compared with the traditional stacked architecture because the solution illustrated by the architecture shown in FIG. 3 can select one NAND memory device at a time.

As new memory technologies increase the number of bits stored in a single cell, the probability for reading, writing and retention errors increases. This necessitates the use of more complete ECC algorithms having codes with increased correction power. To resolve these technical difficulties, it should be apparent by now that the presented embodiments of the present invention provide an architecture in which a single controller manages a stack of NAND flash memories along with executing the ECC algorithm. This architectural allows the host CPU to drive a single memory system with a large error free address space using a standard NAND protocol. By placing the ECC correction capability in the external controller, changes to the ECC algorithm may be facilitated without necessitating flash mask changes. The external controller also permits the use of different technologies for the controller and the NAND memories, and allows memory devices with different shrink levels.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A storage system to couple to a host, the storage system comprising:
 a plurality of NAND memory devices, the plurality of NAND memory devices not internally implementing an error correcting code (ECC) algorithm; and
 a controller external to the plurality of NAND memory devices, the controller to export to the host a virtualized address space to allow the host to drive the storage system as a single NAND memory device even though the storage system includes a plurality of NAND memory devices, the controller further to provide a single virtualized ECC algorithm for each of the plurality of NAND memory devices.

2. The storage system of claim 1, wherein the controller implements an Error Correcting Code (ECC) algorithm and not data management algorithms of wear leveling and bad block management.

3. The storage system of claim 2, wherein the controller includes a protocol interface circuit with a buffer to reduce latency introduced by calculations of the ECC algorithm.

4. The storage system of claim 3, wherein the protocol interface circuit manages a NAND Ready/Busy signal to the host processor to account for ECC algorithm latency.

5. The storage system of claim 1, wherein the controller manages a page size of the each of the plurality of NAND memory devices that are different from a page size of the host.

6. The storage system of claim 1, wherein the controller adapts commands issued by the host that are not supported by the plurality of NAND memory devices.

7. The storage system of claim 1, wherein the controller is a non-volatile memory device configured to redirect data received from the host processor to a selected one or more of the plurality of NAND memory devices.

8. A controller to interface with a plurality of NAND memory devices in a storage system, the controller comprising:
 a protocol interface circuit to exchange signals with a host processor;
 an Error Correcting Code (ECC) engine to implement an ECC algorithm; and
 a NAND interface to manage the plurality of NAND memory devices, the NAND interface configured to emulate commands issued by the host processor that are not supported by the plurality of NAND memory devices, the NAND interface further configured to provide power to a select one of the plurality of NAND memory devices at a time to conserve overall power consumption of the storage system.

9. The controller of claim 8, wherein the controller is a bridge from a host NAND interface to the plurality of NAND memory devices that is to select an ECC algorithm to the host processor for the plurality of NAND memory devices provided in the storage system.

10. The controller of claim 8, wherein the controller manages a page size from the host processor that is different from a page size of the plurality of NAND memory devices.

11. The controller of claim 8, wherein the controller presents a single NAND interface to the host processor that removes a restriction on a number of usable flashes in each of the plurality of NAND memory devices due to available address input cycles.

12. The controller of claim 8, wherein the controller includes a protocol interface circuit with a buffer to transfer data to the host processor having buffering capabilities to read a second page of data for parallelizing ECC algorithm execution in a sequential read operation.

13. The controller of claim 12, wherein the protocol interface circuit manages a NAND Ready/Busy signal to the host processor to account for ECC algorithm latency.

14. A method of managing a stack of NAND memory devices that do not internally implement an Error Correcting Code (ECC) algorithm, the method comprising:
 using a protocol interface block of a controller device to exchange signals with a host processor to allow the host processor to communicate with a large error free address space;
 implementing a single virtualized ECC algorithm by an ECC engine block embedded in the controller device; and
 re-elaborating both commands and addresses received from the host processor by a NAND interface block embedded in the controller device to manage data transfers to the stack of NAND memory devices.

15. The method of claim 14, further including interpreting commands received from the host processor by the protocol interface block to direct the storage of data from the host processor.

16. The method of claim 14, further including loading a buffer in the protocol interface block having buffering capabilities to read a second page of data for parallelizing ECC algorithm execution in a sequential read operation.

17. A wireless communication system including multiple NAND memory devices, the wireless communication system comprising:
 a transceiver;
 a processor having first and second processor cores, the processor being coupled to the transceiver; and
 an Error Correcting Code (ECC) controller having an embedded NAND interface block to receive commands and addresses and exchange signals with the processor, an ECC engine to implement an ECC algorithm, and a NAND interface circuit to re-elaborate both commands and addresses received from the host processor to direct data transfers with the multiple NAND memory devices, the multiple NAND memory devices not internally implementing an ECC algorithm.

18. The wireless communication system of claim 17 wherein the ECC controller further includes a protocol interface circuit having a buffer to reduce latency introduced by calculations of the ECC algorithm.

19. The wireless communication system of claim 17, wherein the ECC controller allows the processor to drive the multiple NAND memory devices as a single NAND memory device while the ECC controller redirects data received from the processor to a selected NAND memory device.

20. The wireless communication system of claim 17 wherein the ECC controller allows the processor to manage a page size that differs from a page size of the multiple NAND memory devices.

\* \* \* \* \*